United States Patent [19]

Sim

[11] Patent Number: 5,675,536
[45] Date of Patent: Oct. 7, 1997

[54] FLASH MEMORY DEVICE

[75] Inventor: Hyun Soo Sim, Sungnam, Rep. of Korea

[73] Assignee: Hyundai Electronics Industries Co., Ltd., Kyungki-Do, Rep. of Korea

[21] Appl. No.: 576,331

[22] Filed: Dec. 21, 1995

[30] Foreign Application Priority Data

Dec. 27, 1994 [KR] Rep. of Korea .................. 94-37298

[51] Int. Cl.$^6$ .................................................. G11C 11/34
[52] U.S. Cl. .............................. 365/185.22; 365/185.21
[58] Field of Search ...................... 365/185.22, 185.21, 365/185.29, 185.3

[56] References Cited

U.S. PATENT DOCUMENTS 5,243,573  9/1993  Makihara et al. ............... 365/185.21

FOREIGN PATENT DOCUMENTS 59-61072  4/1984  Japan .

Primary Examiner—Joseph A. Popek
Attorney, Agent, or Firm—Fish & Richardson, P.C.

[57] ABSTRACT

The present invention discloses a flash memory cell which can prevent an over programming in a way that uses a cross coupled latch circuit and peripheral circuits upon a byte programming into a flash memory cell programmed by hot electron injection.

8 Claims, 2 Drawing Sheets

FLASH MEMORY DEVICE

FIELD OF THE INVENTION

The present invention relates to a flash memory device, and more particularly to a flash memory device which can prevent an over programming upon a byte programming into the flash memory cell which is programmed by hot electron injection.

BACKGROUND THE INVENTION

In general, the flash memory device programmed by hot electron injection comprises a plurality of memory blocks. For example, if the flash memory device comprises eight(8) memory blocks, we can program eight(8) memory cells simultaneously by selecting one memory cell from each memory block. Such a program method is called to byte program. For example, if seven(7) memory cells are sufficiently programmed by the byte program but the remaining one(1) memory cell is not programmed, the byte program is performed into the eight memory cells again. As a result, the seven memory cells sufficiently programmed are over-programmed. Therefore, it has a drawback that reduces the reliability in the memory cells.

SUMMARY OF THE INVENTION

Accordingly, the purpose of the present invention is to provide a flash memory device which can overcome the above drawback.

To achieve the above purpose, a flash memory device according to the present invention, comprises: a first switching means for switching a latched program data signal; a second switching means for switching a supply of the power supply voltage based on a program verification enable signal; a third switching means for switching a supply of the drain voltage for programing based on a program enable-bar signal; a fourth switching means for switching a supply of the ground voltage based on the program enable-bar signal; a cross coupled latch circuit having two nodes, for latching the inversed voltages in the each node based on the switching of the first, second, third and fourth switching means; a fifth switching means for switching a supply of voltage for one node among voltages which are latched into the cross coupled latch circuit based on the program enable-bar signal; a column decoder for supplying a voltage via the fifth switching means to a selected memory cell based on a column decoder signal; and a sixth switching means for supplying a threshold voltage from the selected memory cell to an another node in the cross coupled latch circuit.

The present invention does not allow the memory cell sufficiently programmed to be programmed again when programming the memory cell which is not programmed.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

An embodiment of the present invention will be described hereunder in detail by reference to the accompanying drawings.

Figure 1:
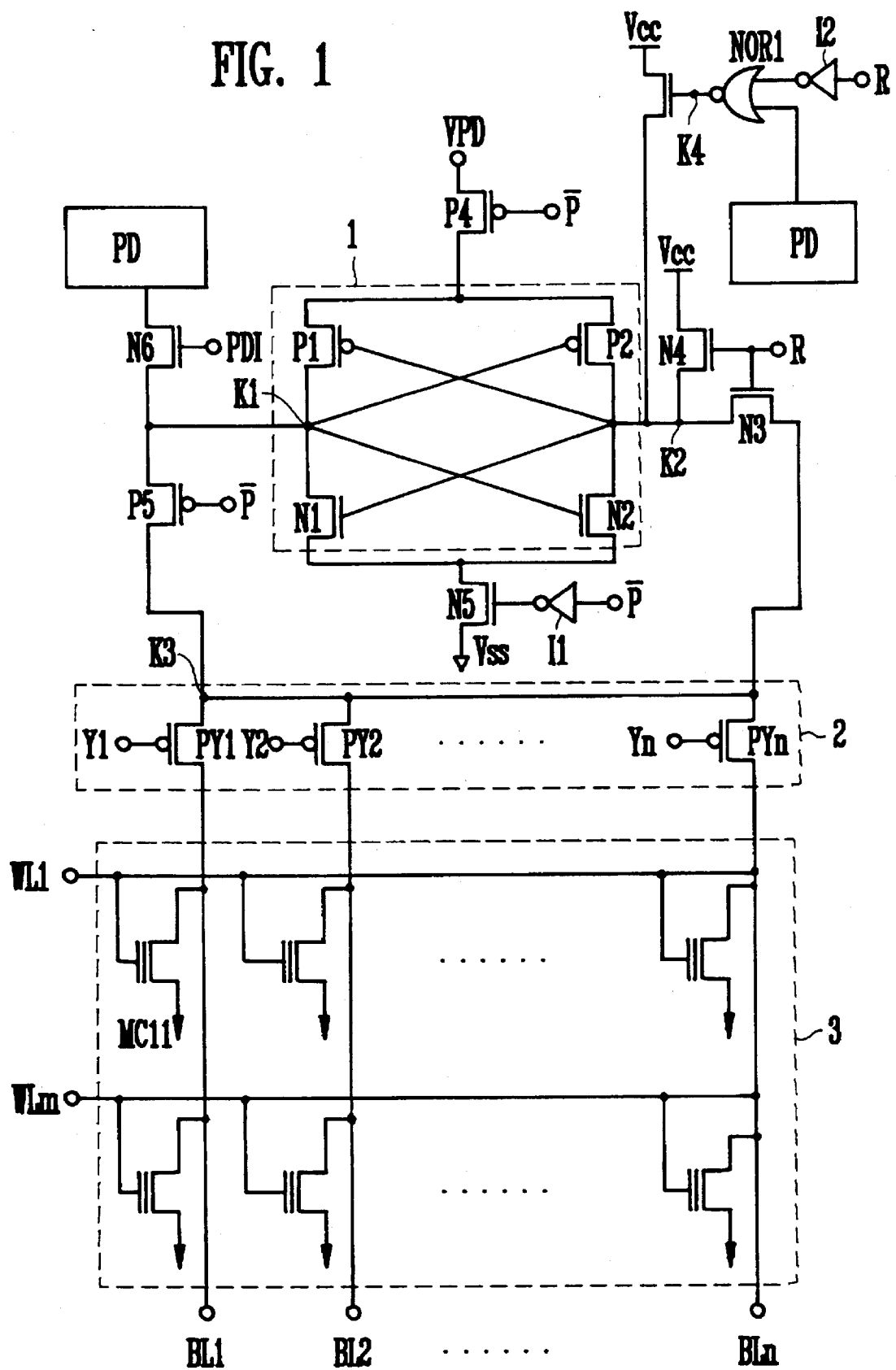
FIG. 1 shows a circuit of a flash memory device according to the present invention.
Figure 2:
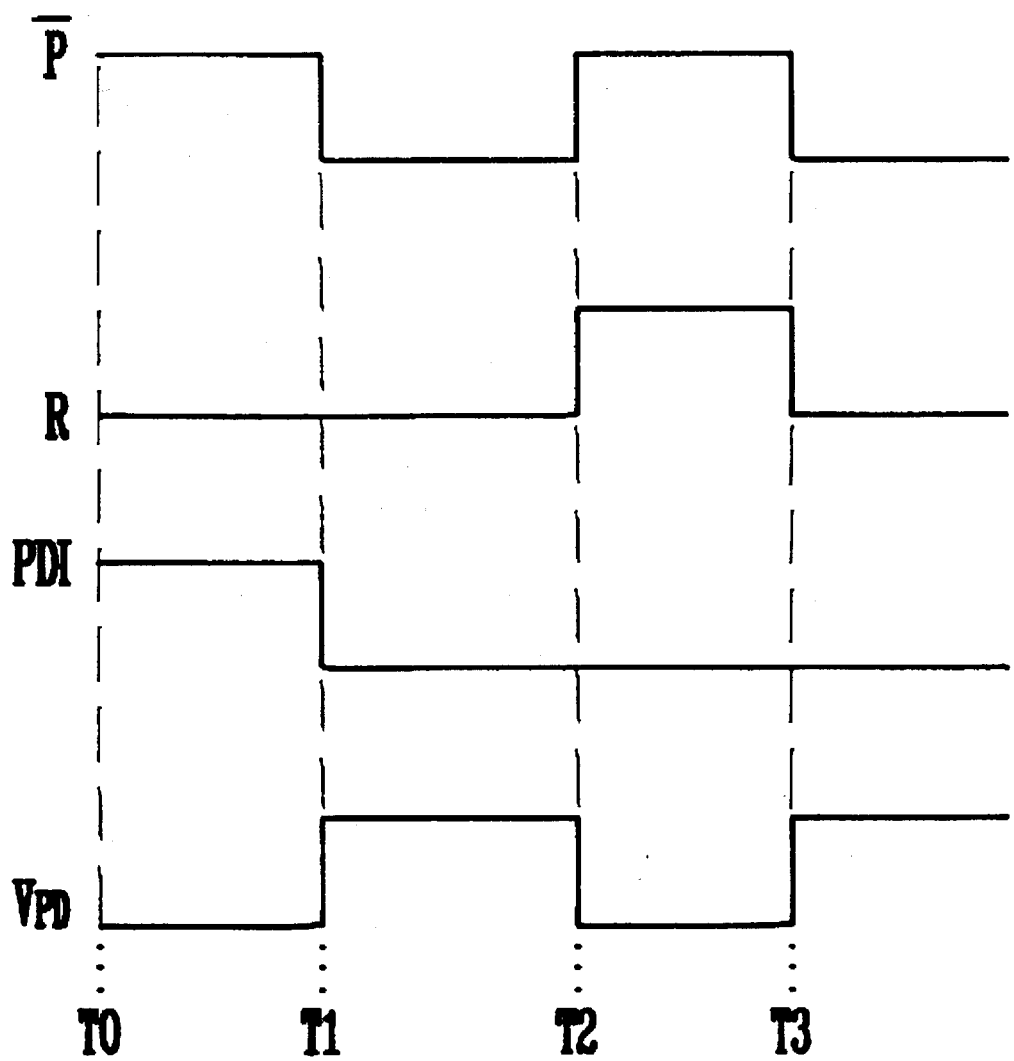
FIG. 2 shows a waveform for explaining the operation of FIG. 1.

FIG. 1 shows a circuit of a flash memory device in accordance with the present invention, and the operation thereof will be described by reference to FIG. 2.

In case of a byte programming, though at least eight(8) circuits same with FIG. 1 are required, only one circuit is shown for the convenience of explanation.

First, the stand-by operation (T0 time in FIG. 2) before a byte programming will be explained hereunder.

The program enable-bar signal $\bar{P}$ and the program data input signal PDI are at a HIGH state and the drain voltage VPD and the program verification enable signal R during a programming are at a LOW state. The latched program data signal PD is at a HIGH state. Then the NMOS transistor N6 of a first switching means is turned on by the program data input signal PDI. Therefore, the voltage level at the node K1 is maintained at a HIGH state by the latched program data signal PD. Also the voltage level at the node K4 which is the output of a NOR gate NOR1 to which the latched program data signal PD and the program verification enable signal R via an inverse gate I2 is input, becomes a LOW state. Therefore, the NMOS transistor N7 is turned off. Then as the NMOS transistors N3 and N4 of sixth and second switching means to which the program verification enable signal R is input are turned off, the voltage level at the node K2 is maintained at a LOW state. Then the PMOS transistor P2 is turned off while the PMOS transistor P1 in the cross coupled latch circuit 1 is turned on. Also the PMOS transistor P4 to which the program enable-bar signal $\bar{P}$ is input and the NMOS transistor N5 is input which is the input to the program enable-bar signal $\bar{P}$ via the inverse gate I1 are turned on. Therefore, upon a programming the drain voltage VPD is applied to the node K1. Then the NMOS transistor N2 in the cross coupled latch circuit 1 is turned on. Accordingly, the ground voltage $V_{ss}$ is supplied to the node K2. That is, the voltage level in the node K1 is latched into a HIGH state and the voltage level in the node K2 is latched into a LOW state, respectively.

Below, the operation of the byte programming (T1 time in FIG. 2) which is a subsequent mode in a program algorithm will be described hereunder.

The program enable-bar signal P and the program data input signal PDI change from a HIGH state to a LOW state. The drain voltage VPD during a programming changes from a LOW state to a HIGH state, and the program verification enable signal R becomes a LOW state. The latched program data signal PD is a HIGH state. Then the NMOS transistor N6 of a first switching means is turned off by means of the program data input signal PDI. The voltage level in the node K1 is maintained at a HIGH state by means of the program data signal PD which is latched at a stand-by mode. Also, the voltage level in the node K4 which is the output of the NOR gate NOR1 to which each of the latched program data signal PD and the program verification enable signal R via the inverse gate is input I2 becomes a LOW state. Therefore, the NMOS transistor N7 is turned off. As the NMOS transistor N3 and N4 of sixth and second switching means to which the program verification enable signal R is input is turned off, the voltage level in the node K2 becomes a LOW state. Then the PMOS transistor P1 in the cross coupled latch circuit 1 is turned on. The PMOS transistor P2 is turned off while the PMOS transistor P1 in the cross coupled latch circuit 1 is turned on. Also, the PMOS transistor P4 of a third switching means to which the program enable-bar signal $\bar{P}$ is input and the NMOS transistor N5 of a fourth switching means to which the program enable-bar signal $\bar{P}$ via the inverse gate I1 is input are turned on. Therefore, the drain voltage VPD for programming is supplied to the node K1. Then the NMOS transistor N2 in the cross coupled latch circuit 1 is turned on. As a result, the ground voltage is supplied to the node K2.

That is, the voltage level in the node K1 maintains the drain voltage VPD for programming by the operation of the cross coupled latch circuit 1, and the voltage level in the node K2 maintains the ground voltage $V_{ss}$.

Then as the PMOS transistor P5 of a fifth switching means to which the program enable-bar signal $\overline{P}$ is input is turned on, the drain voltage VPD is supplied to the node K3 during a programming. Therefore, if we assume that the plurality of PMOS transistors PY1 to PYn in the column decoder 2 which each of the column decoder signals Y1 to Yn is input, for example, the PMOS transistor PY1 is selected and the word line WL1 is activated selected, the voltage in the node K3 is supplied to the memory cell MC11 in a memory block 3. That is, the drain voltage VPD is supplied to the memory cell MC11 during a programming.

Accordingly, the byte program is performed for the 8 memory cells which are selected from each memory block based on selection of the word line and the column decoder.

On the other hand, the operation upon a program verification (T2 time in FIG. 2) which is a subsequent mode in a program algorithm will be described hereunder.

The drain voltage VPD for programing changes from a HIGH state to a LOW state and the program data input signal PDI is maintained at a LOW state, and the program enable-bar signal $\overline{P}$ and the program verification enable signal R change from a LOW state to a HIGH state. The latched program data signal PD is at a HIGH state. Then the voltage level in the node K4 which is the output of the NOR gate NOR1 to which the latched program data signal PD is input and the program verification enable signal R via the inverse gate I2 becomes a LOW state. Therefore, the NMOS transistor N7 is turned off. Also, the PMOS transistor P4 and the NMOS transistor N5 of third and fourth switching means to which the program enable-bar signal $\overline{P}$ is input are turned off. And the NMOS transistor N6 of a first switching means to which the program data input signal PDI is input and the PMOS transistor P5 of a fifth switching means to which the program enable-bar signal P is input are turned off. Then as the NMOS transistors N3 and N4 of sixth and second switching means to which to the program verification enable signal R is input are turned on, the voltage level in the node K2 becomes a HIGH state. Therefore, the power supply Vcc is supplied to the node K3 via the NMOS transistor N3. Accordingly, if we assume that a plurality of PMOS transistors PY1 to PYn in the column decoder 2 to which each of the column decoder signals Y1 to Yn is input, for example, the PMOS transistor PY1 is activated and the word line WL1 is selected, the voltage in the node K3 is supplied to the memory cell MC11 in the memory block 3. That is, the power supply Vcc is supplied to the memory cell MC11.

Therefore, the verification operation of byte program is performed for the 8 memory cells selected from each memory block based on selection of the word line and the column decoder.

If the 8 memory cells selected from each memory block are at a sufficiently programmed state upon a verification operation of the byte program, the current flowing through the memory cells is blocked and so the voltage level in the node K2 is maintained at a HIGH state. That is, for example, if the memory cell MC11 is sufficiently programmed during the verification operation of the byte program, the NMOS transistor N1 in the cross coupled latch circuit 1 is turned on because the threshold voltage in the memory cell MC11 becomes higher and so the voltage level in the node K2 becomes a HIGH state. Therefore, the voltage level in the node K2 is latched into the ground voltage $V_{ss}$. As a result, as the ground voltage $V_{ss}$ is supplied to the memory cell MC11 selected from the memory block, the memory cell MC11 is no longer programmed.

However, if at least one memory cell of the 8 selected memory cells is not at a programmed state (that is, at a deleted state), the voltage level in the node K2 changes from a HIGH state to a LOW state because the current is caused to flow through the memory cells. For example, if the memory cell MC11 is not at a sufficiently programmed state, the voltage level in the node K2 becomes a LOW state because the threshold voltage in the memory cell MC11 becomes lower and so the PMOS transistor P1 in the cross coupled latch circuit 1 is turned on. Therefore, the voltage level in the node K1 is latched into the drain voltage VPD for programming. Accordingly, as the drain voltage VPD is supplied to the memory cell MC11 selected from a memory block upon a programming, the memory cell MC11 is reprogrammed (T3 time in FIG. 2).

That is, the above programming operation performs again only for the memory block cells in which the memory cells are not at a programmed state.

On the other hand, when the latched program data signal PD is at a LOW state the latched program data signal PD which is at a LOW state during a byte programming into the memory cells is supplied to the node K1. Then, the drain voltage for programing VPD and the ground voltage are latched into the nodes K2 and K1 by the operation of the cross coupled latch circuit 1, respectively. Therefore, as the ground voltage $V_{ss}$ is supplied to the drain electrode of the memory cell selected from each memory block, the program operation is blocked.

As described above, the present invention has an excellent effect which can prevent an over programming in a way that uses a cross coupled latch circuit and peripheral circuits upon a byte programming into a flash memory cell which is programmed by hot electron injection.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:
1. A flash memory device, comprising:
 a first switching means for supplying a latched program data signal to a first node according to a program data input signal;
 a second switching means for supplying a power supply voltage to a second node based on a program verification enable signal;

a third switching means for supplying a drain voltage when programming to a third node based on a program enable-bar signal;

a fourth switching means for supplying a ground potential to a fourth node based on said program enable-bar signal;

a cross coupled latch circuit coupled between said third node and said fourth node, for latching said drain voltage or said power supply voltage in said first and second nodes based on the switching of said first, second, third and fourth switching means;

a fifth switching means for supplying said drain voltage of said first node to a fifth node based on said program enable-bar signal;

a column decoder for supplying said drain voltage via said fifth switching means to a selected memory cell based on column decoder signals; and a sixth switching means for supplying said power supply voltage to said fifth node according to said program verification enable signal.

2. A flash memory device set forth in claim 1, wherein said first switching means comprises a NMOS transistor for switching said latched program data signal based on said program data input signal.

3. A flash memory device set forth in claim 1, wherein said second switching means comprises a NMOS transistor for switching said power supply voltage based on said program verification enable signal.

4. A flash memory device set forth in claim 1, wherein said third switching means comprises a PMOS transistor for switching said drain voltage based on said program enable-bar signal.

5. A flash memory device set forth in claim 1, wherein said fourth switching means comprises a NMOS transistor for switching said ground voltage based on said program enable-bar signal.

6. A flash memory device set forth in claim 1, wherein said fifth switching means comprises a PMOS transistor for supplying said drain voltage to said fifth node based on said program enable-bar signal.

7. A flash memory device set forth in claim 1, wherein said sixth switching means comprises a NMOS transistor for supplying said power supply voltage to said fifth node based on said program verification enable signal.

8. A flash memory device set forth in claim 1, wherein said column decoder comprises a plurality of PMOS transistors to which each column decoder signal is input.

* * * * *